(12) United States Patent
Pushp

(10) Patent No.: US 11,011,375 B1
(45) Date of Patent: May 18, 2021

(54) HYBRID TEMPLATE AREA SELECTIVE EPITAXY (HTASE)

(71) Applicant: INTERNATIONAL BUSINESS MACHINES CORPORATION, Armonk, NY (US)

(72) Inventor: Aakash Pushp, Santa Clara, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/684,581

(22) Filed: Nov. 14, 2019

(51) Int. Cl.
| | |
|---|---|
| *H01L 21/02* | (2006.01) |
| *H01L 21/033* | (2006.01) |
| *H01L 21/285* | (2006.01) |
| *H01L 21/308* | (2006.01) |

(52) U.S. Cl.
CPC .... *H01L 21/02639* (2013.01); *H01L 21/0262* (2013.01); *H01L 21/02068* (2013.01); *H01L 21/02381* (2013.01); *H01L 21/02546* (2013.01); *H01L 21/0332* (2013.01); *H01L 21/28568* (2013.01); *H01L 21/3081* (2013.01)

(58) Field of Classification Search
CPC ......... H01L 21/02639; H01L 21/02068; H01L 21/02381; H01L 21/02546; H01L 21/0262; H01L 21/0332; H01L 21/28568; H01L 21/3081
USPC .......................................................... 438/2
See application file for complete search history.

(56) References Cited

U.S. PATENT DOCUMENTS

| | | | |
|---|---|---|---|
| 5,420,101 A | | 5/1995 | Copetti et al. |
| 6,794,338 B2 | | 9/2004 | Storer et al. |
| 2019/0131511 A1 | | 5/2019 | Clarke et al. |
| 2019/0131513 A1 | | 5/2019 | Krogstrup et al. |
| 2020/0235276 A1 | * | 7/2020 | Aseev ................... G06N 10/00 |
| 2020/0381250 A1 | * | 12/2020 | Miyazoe .......... H01L 21/02181 |

FOREIGN PATENT DOCUMENTS

WO     2019074557 A1     4/2019

OTHER PUBLICATIONS

Gill et al., "Selective-Area Superconductor Epitaxy to Ballistic Semiconductor Nanowires," Nano Letters, 18, 10, Sep. 10, 2018, pp. 6121-6128.

* cited by examiner

*Primary Examiner* — Tong-Ho Kim
(74) *Attorney, Agent, or Firm* — Schmeiser, Olsen & Watts, LLP; Keivan Razavi

(57) ABSTRACT

A hybrid template assisted selective epitaxy (HTASE) process is described comprising the steps of: depositing a template oxide layer on top of a silicon fin; opening a via in a selected portion of the template oxide to expose a portion of the encapsulated silicon fin and subsequently growing a nitride superconductor layer on top of the exposed silicon fin thereby forming a hybrid encapsulation of the silicon fin; performing a back-etch of the silicon fin to remove a portion (e.g., 5 nm-20 um) of the silicon fin; growing a layer formed from a group III/group V compound within an area where the silicon fin was removed via the back-etch; and if needed, removing the template oxide layer.

27 Claims, 6 Drawing Sheets

Hybrid TASE

HYBRID TEMPLATE AREA SELECTIVE EPITAXY (HTASE)

This invention was made with government support under 140D6318C0028 awarded by Defense Advanced Research Projects Agency (DARPA). The government has certain rights to this invention.

BACKGROUND OF THE INVENTION

Field of Invention

The present invention relates generally to the field of traditional template assisted selective epitaxy (TASE). More specifically, the present invention is related to a novel hybrid template assisted selective epitaxy (TASE).

Discussion of Related Art

FIGS. 1A-F depict steps in a traditional template assisted selective epitaxy (TASE) process. In FIG. 1A, the structure comprises a silicon (Si) substrate 102, a silicon dioxide ($SiO_2$) layer 104 disposed on top of the silicon substrate 102, and a silicon (Si) layer 106.

In FIG. 1B, a silicon layer is etched to form a silicon fin 108. This can be achieved using nanofabrication in several different ways; non-limiting examples of such ways include: (1) ion milling the remainder of the Si region 106 while protecting the fin region 108, (2) chemical etch techniques and/or (3) wet etching (or any combination of these or other standard subtractive etching techniques).

In FIG. 1C, a template oxide layer 110 is deposited on top, as well as all around a silicon fin 108 so as to encapsulate the fin 108. Non-limiting examples of techniques of how this could be performed include: an atomic layer deposition (ALD) technique, a plasma enhanced chemical vapor deposition (PE-CVD) technique, a physical vapor deposition (PVD) technique, or by thermal oxidation of the exposed Silicon layer of 108 in pure oxygen (or a combination of these techniques, or any other standard film growth techniques).

In FIG. 1D, a one-sided oxide removal process is performed exposing a portion 112 to of the silicon fin 108. Nonlimiting examples of such a process include any of the following techniques: (1) ion milling one end of the oxide region 110 that encapsulates the part of the silicon fin indicated by 112 while protecting the remainder of the oxide region 110, (2) chemical etch techniques, and/or (3) wet etching (or any combination of these or other standard subtractive etching techniques).

In FIG. 1E, a back-etch of the silicon fin is performed to remove 5 nm-20 um of the silicon fin using wet chemistry by either using a selective wet chemical such as potassium hydroxide (KOH) or Tetramethylammonium hydroxide (TMAH), or a combination of the two, or any other selective wet etching process that selectively etches the Si fin 108 without substantially etching the encapsulant 110.

In FIG. 1F, a layer 114 is formed from a group III/group V compound (e.g., InAs) using a metal organic chemical vapor deposition (MOCVD) process, within an area where the silicon fin was removed via the back-etch.

Lastly, the template oxide layer 110 may or may not be removed.

In this traditional approach, the limitation is in forming pristine and stable electrical contacts to the III/V nanowire structure.

Embodiments of the present invention are an improvement over prior art systems and methods.

SUMMARY OF THE INVENTION

In one aspect, the present invention provides a hybrid template assisted selective epitaxy (HTASE) method comprising the steps of: (a) depositing a template oxide layer on top of a silicon fin; (b) opening a via in a selected portion of the template oxide to expose a portion of the encapsulated silicon fin and growing a nitride superconductor layer on top of the exposed silicon fin thereby forming a hybrid encapsulation of the silicon fin; (c) performing a one-sided oxide removal process and exposing a portion of the silicon fin; (d) performing a back-etch of the silicon fin to remove a portion (e.g., 5 nm-20 um) of the silicon fin; and (e) growing a layer formed from a group III/group V compound within an area where the silicon fin was removed via the back-etch.

In another aspect, the present invention provides a hybrid template assisted selective epitaxy (HTASE) method comprising the steps of: (a) etching a silicon layer and forming a silicon fin, the silicon layer located on top of a silicon dioxide layer, the silicon dioxide layer located on top of a silicon substrate; (b) depositing a template oxide layer on top of the silicon fin; (c) opening a via in a selected portion of the template oxide to expose a portion of the encapsulated silicon fin and growing a nitride superconductor layer on top of the exposed silicon fin thereby forming a hybrid encapsulation of the silicon fin; (d) performing a one-sided oxide removal process and exposing a portion of the silicon fin; (e) performing a back-etch of the silicon fin to remove a portion (e.g., 5 nm-20 um) of the silicon fin; (f) performing in-situ annealing at ultra-high vacuum (UHV) to clean the undersurface of the nitride superconductor layer; and (g) growing a layer formed from a group III/group V compound within an area where the silicon fin was removed via the back-etch.

In yet another aspect, the present invention provides a hybrid template assisted selective epitaxy (HTASE) method comprising the steps of: (a) etching a silicon layer and forming a silicon fin, the silicon layer located on top of a silicon dioxide layer, the silicon dioxide layer located on top of a silicon substrate; (b) depositing a template oxide layer on top of the silicon fin; (c) opening a via in a selected portion of the template oxide to expose a portion of the encapsulated silicon fin and growing a TiN superconductor layer on top of the exposed silicon fin thereby forming a hybrid encapsulation of the silicon fin; (d) performing a one-sided oxide removal process and exposing a portion of the silicon fin; (e) performing a back-etch of the silicon fin to remove a portion (e.g., 5 nm-20 um) of the silicon fin using tetramethyl ammonium hydroxide (TMAH) and/or potassium hydroxide (KOH); (f) performing in-situ annealing at ultra-high vacuum (UHV) to clean an undersurface of the TiN superconductor layer; and (g) growing a layer formed from InAs within an area where the silicon fin was removed via the back-etch.

BRIEF DESCRIPTION OF THE DRAWINGS

The present disclosure, in accordance with one or more various examples, is described in detail with reference to the following figures. The drawings are provided for purposes of illustration only and merely depict examples of the disclosure. These drawings are provided to facilitate the reader's understanding of the disclosure and should not be considered limiting of the breadth, scope, or applicability of the disclosure. It should be noted that for clarity and ease of illustration these drawings are not necessarily made to scale.

DESCRIPTION OF THE PREFERRED EMBODIMENTS

Figure 1A:
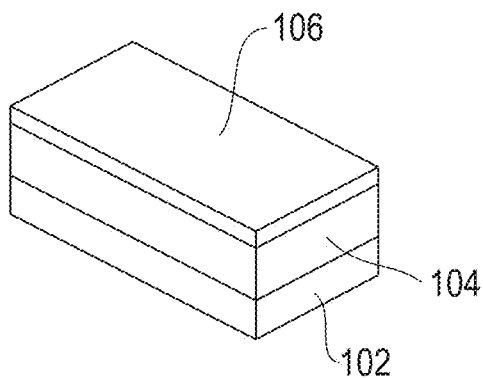
FIGS. 1A-F illustrate the prior art template assisted selective epitaxy (TASE).
Figure 1B:
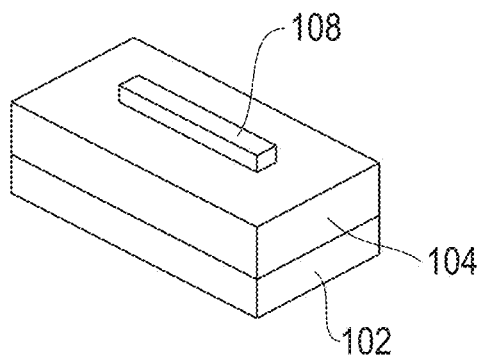
Figure 1C:
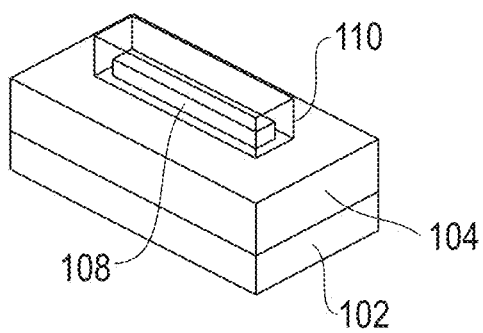
Figure 1D:
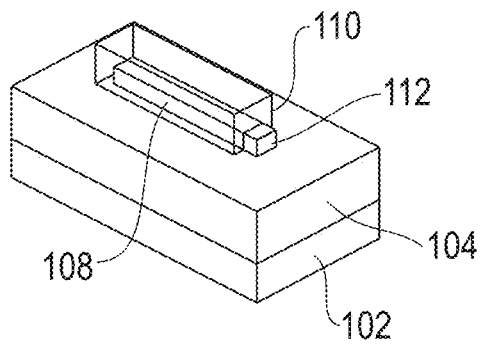
Figure 1E:
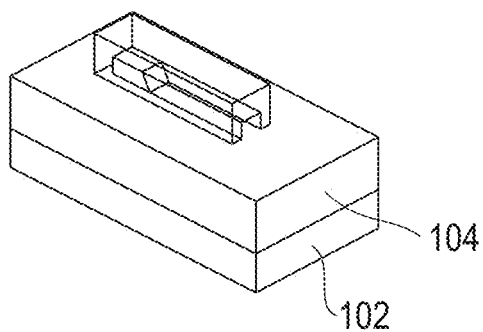
Figure 1F:
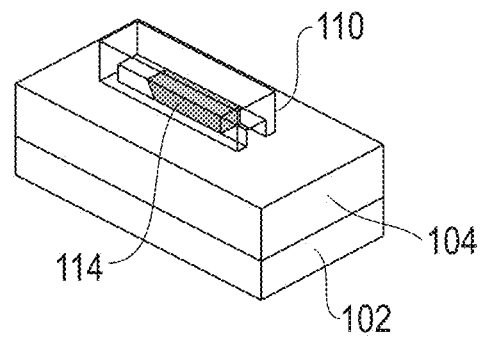

While this invention is illustrated and described in a preferred embodiment, the invention may be produced in many different configurations. There is depicted in the drawings, and will herein be described in detail, a preferred embodiment of the invention, with the understanding that the present disclosure is to be considered as an exemplification of the principles of the invention and the associated functional specifications for its construction and is not intended to limit the invention to the embodiment illustrated. Those skilled in the art will envision many other possible variations within the scope of the present invention.

Note that in this description, references to "one embodiment" or "an embodiment" mean that the feature being referred to is included in at least one embodiment of the invention. Further, separate references to "one embodiment" in this description do not necessarily refer to the same embodiment; however, neither are such embodiments mutually exclusive, unless so stated and except as will be readily apparent to those of ordinary skill in the art. Thus, the present invention can include any variety of combinations and/or integrations of the embodiments described herein.

Figure 2A:
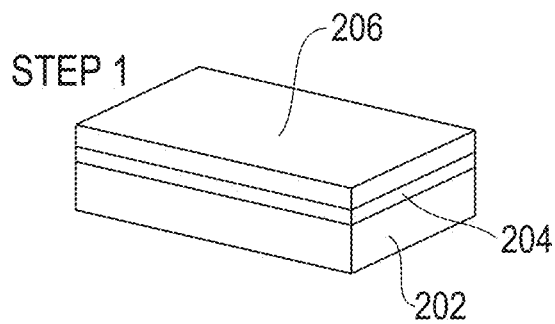
FIGS. 2A-H illustrate the present invention's hybrid template assisted selective epitaxy (HTASE).

FIGS. 2A-H depict steps in the present invention's hybrid template assisted selective epitaxy (HTASE) process. In FIG. 2A, the structure comprises a silicon (Si) substrate 202, a silicon dioxide ($SiO_2$) layer 204 disposed on top of the silicon substrate 202, and a silicon (Si) layer 206.

Figure 2E:
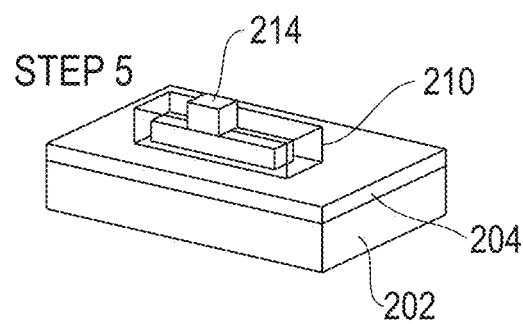
Figure 2B:
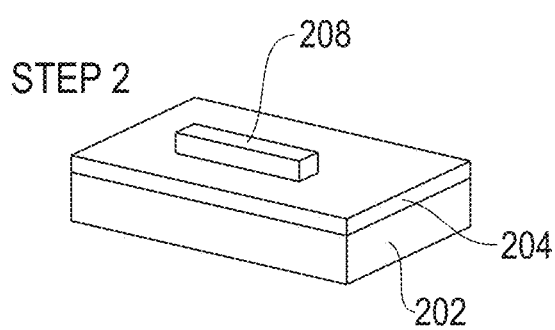

In FIG. 2B, a silicon layer is etched to form a silicon fin 208. This can be achieved using nanofabrication in several different ways; non-limiting examples of such ways include: (1) ion milling the remainder of the Si region 206 while protecting the fin region 208, (2) chemical etch techniques and/or (3) wet etching (or any combination of these or other standard subtractive etching techniques.

Figure 2F:
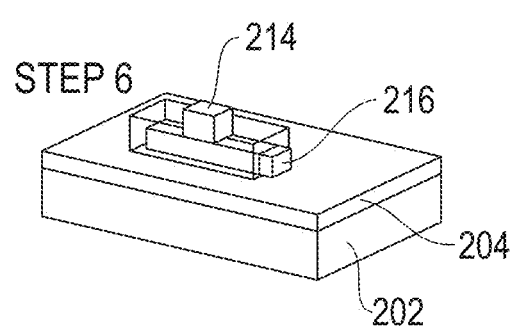
Figure 2C:
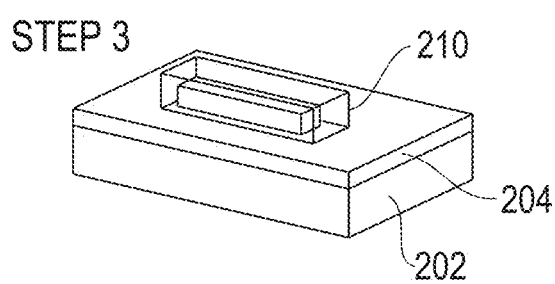

In FIG. 2C, a template oxide layer 210 is deposited on top of a silicon fin 208. Non-limiting examples of techniques of how this could be performed include: an atomic layer deposition (ALD) technique, a plasma enhanced chemical vapor deposition (PE-CVD) technique, a physical vapor deposition (PVD) technique, or by thermal oxidation of the exposed Silicon layer of 208 in pure oxygen (or a combination of these techniques, or any other standard film growth techniques).

Figure 2G:
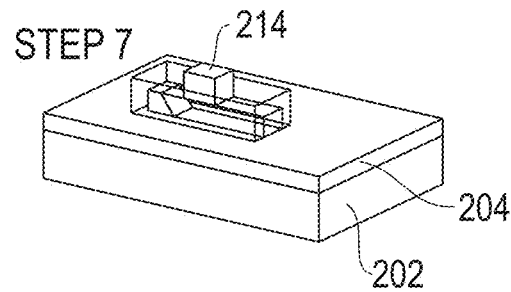
Figure 2D:
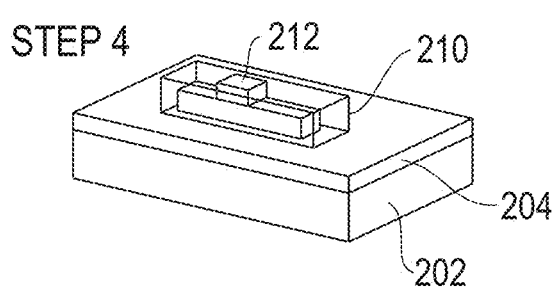

In FIG. 2D, a selected portion 212 of the template oxide layer 210 is removed to expose a portion of the encapsulated silicon fin 208. Such removal can be achieved using nanofabrication in several different ways; non-limiting examples of such techniques include: (1) ion milling techniques (where the selected portion 212 of the oxide region that encapsulates the part of the silicon fin indicated by 208, while protecting the remainder of the oxide region 210), (2) chemical etch techniques and/or (3) wet etching techniques, or any combination of these or other standard subtractive etching techniques.

In FIG. 2E, a nitride superconductor layer 214 is grown on top of the exposed silicon fin. This can be achieved using nanofabrication in several different ways; for example, this can be achieved by: (1) magnetron sputtering nitride superconductor (for example TiN, VN, ZrN, MoN, WN, etc. or combinations thereof) right after opening the via 212 and (2) chemical vapor deposition of a nitride superconductor (for example TiN, VN, ZrN, MoN, WN, etc. or combination thereof) right after opening the via 212.

In FIG. 2F, a one-sided oxide removal process is performed exposing a portion 216 of the silicon fin 208. This can be achieved using nanofabrication in several different ways; for example, the following techniques may be used: (1) ion milling one end of the oxide region 210 that encapsulates the part of the silicon fin indicated by 216 while protecting the remainder of the oxide region 210, (2) chemical etch techniques, and/or (3) wet etching (or any combination of these or other standard subtractive etching techniques).

In FIG. 2G, a back-etch of the silicon fin is performed to remove 5 nm-20 um of the silicon fin 208 using wet chemistry by either using a selective wet chemical such as potassium hydroxide (KOH) or Tetramethylammonium hydroxide (TMAH) (or a combination of the two or any other selective wet etching process that selectively etches the Si fin 208 without substantially etching the hybrid encapsulant formed from 210 and 214).

Figure 2H:
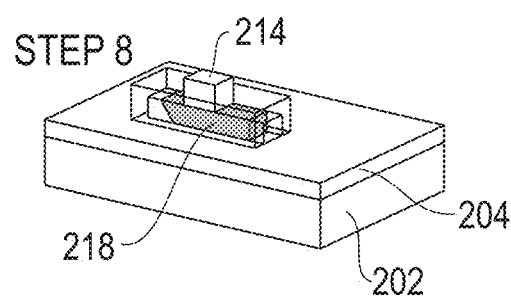

In FIG. 2H, a layer 218 is formed from a group III/group V compound (e.g., InAs) using metal organic chemical vapor deposition (MOCVD) process, within an area where the silicon fin was removed via the back-etch.

Lastly, the template oxide layer 210 may or may not be removed.

Figure 3:
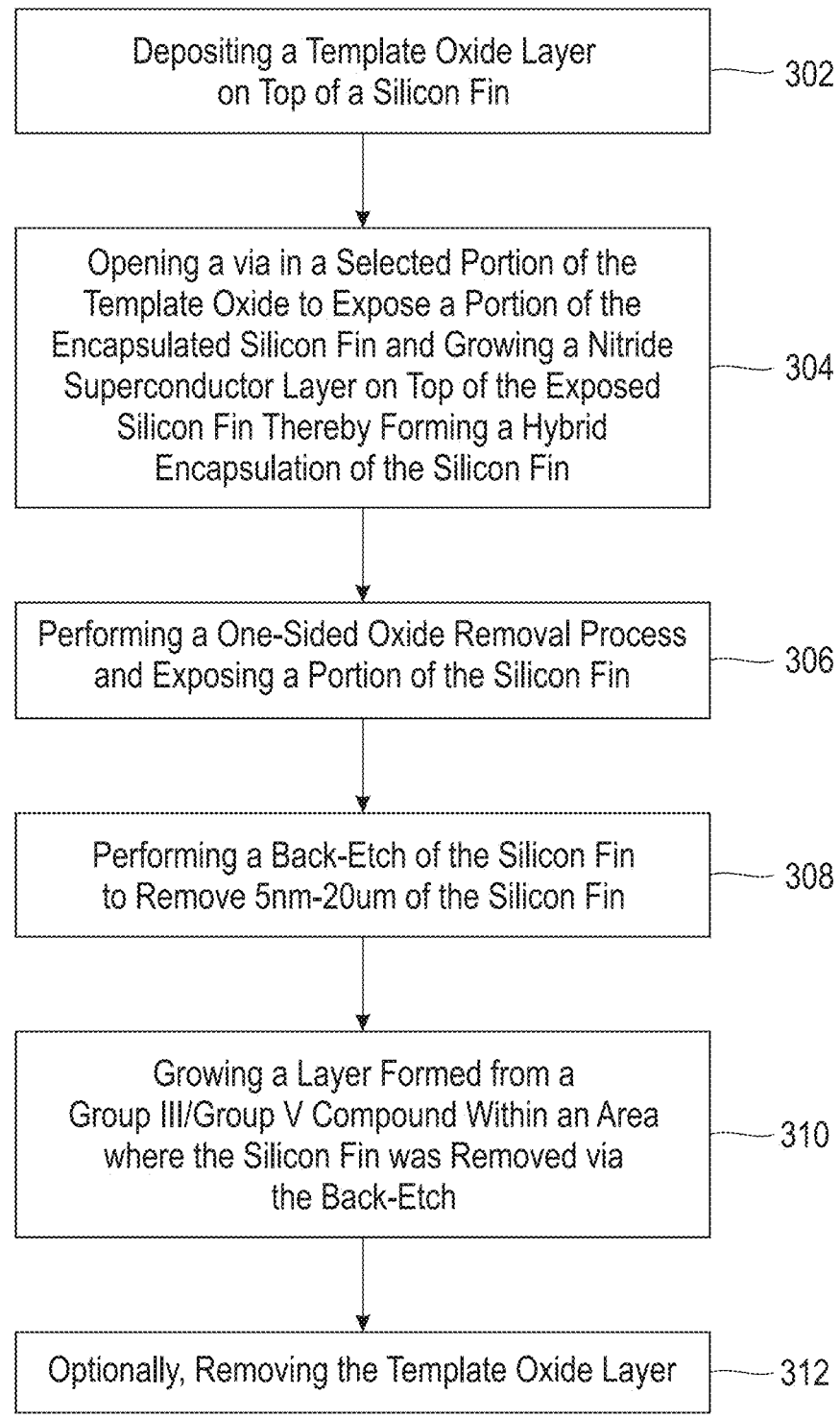
FIG. 3 depicts one aspect of the present invention's hybrid template assisted selective epitaxy (HTASE) method.

FIG. 3 depicts one aspect of the present invention's hybrid template assisted selective epitaxy (HTASE) method. The method, according to this aspect, comprises the steps of: (a) depositing a template oxide layer on top of a silicon fin—step 302; (b) opening a via in a selected portion of the template oxide to expose a portion of the encapsulated silicon fin and growing a nitride superconductor layer on top of the exposed silicon fin thereby forming a hybrid encapsulation of the silicon fin—step 304; (c) performing a one-sided oxide removal process and exposing a portion of the silicon fin—step 306; (d) performing a back-etch of the silicon fin to remove a portion (e.g., 5 nm-20 um) of the silicon fin—step 308; (e) growing a layer formed from a group III/group V compound within an area where the silicon fin was removed via the back-etch—step 310; and (f) if needed, removing the template oxide layer—step 312.

Figure 4:
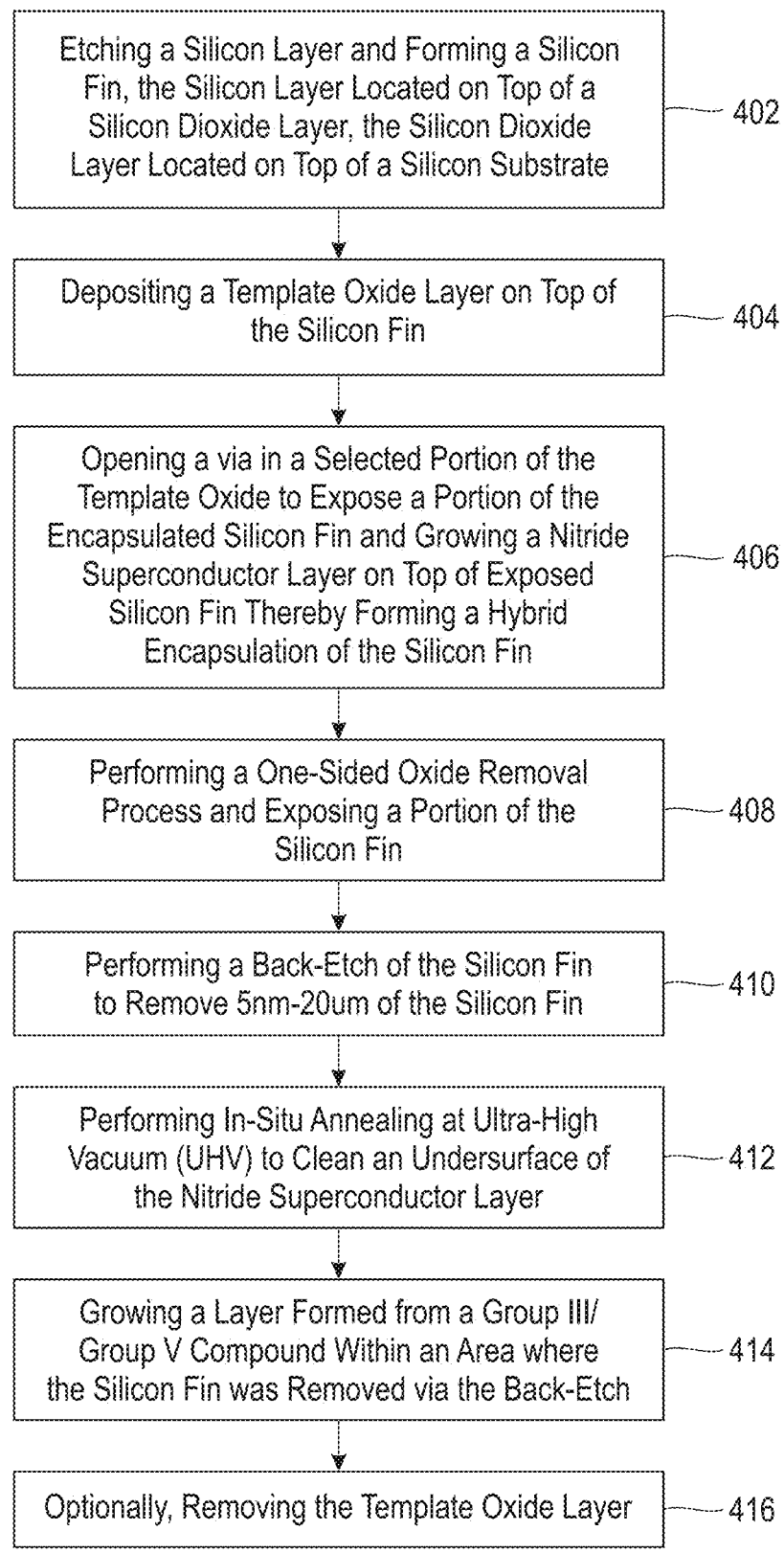
FIG. 4 depicts another aspect of the present invention's hybrid template assisted selective epitaxy (HTASE) method.

FIG. 4 depicts another aspect of the present invention's hybrid template assisted selective epitaxy (HTASE) method. The method, according to this aspect, comprises the steps of: (a) etching a silicon layer and forming a silicon fin, the silicon layer located on top of a silicon dioxide layer, the silicon dioxide layer located on top of a silicon substrate—step 402; (b) depositing a template oxide layer on top of the silicon fin—step 404; (c) opening a via in a selected portion of the template oxide to expose a portion of the encapsulated silicon fin and growing a nitride superconductor layer on top of the exposed silicon fin thereby forming a hybrid encapsulation of the silicon fin—step 406; (d) performing a one-sided oxide removal process and exposing a portion of the silicon fin—step 408; (e) performing a back-etch of the silicon fin to remove a portion (e.g., 5 nm-20 um) of the silicon fin—step 410; (f) performing in-situ annealing at ultra-high vacuum (UHV) to clean an undersurface of the nitride superconductor layer—step 412; (g) growing a layer formed from a group III/group V compound within an area where the silicon fin was removed via the back-etch—step 414; and (h) if needed, removing the template oxide layer—step 416.

Figure 5:
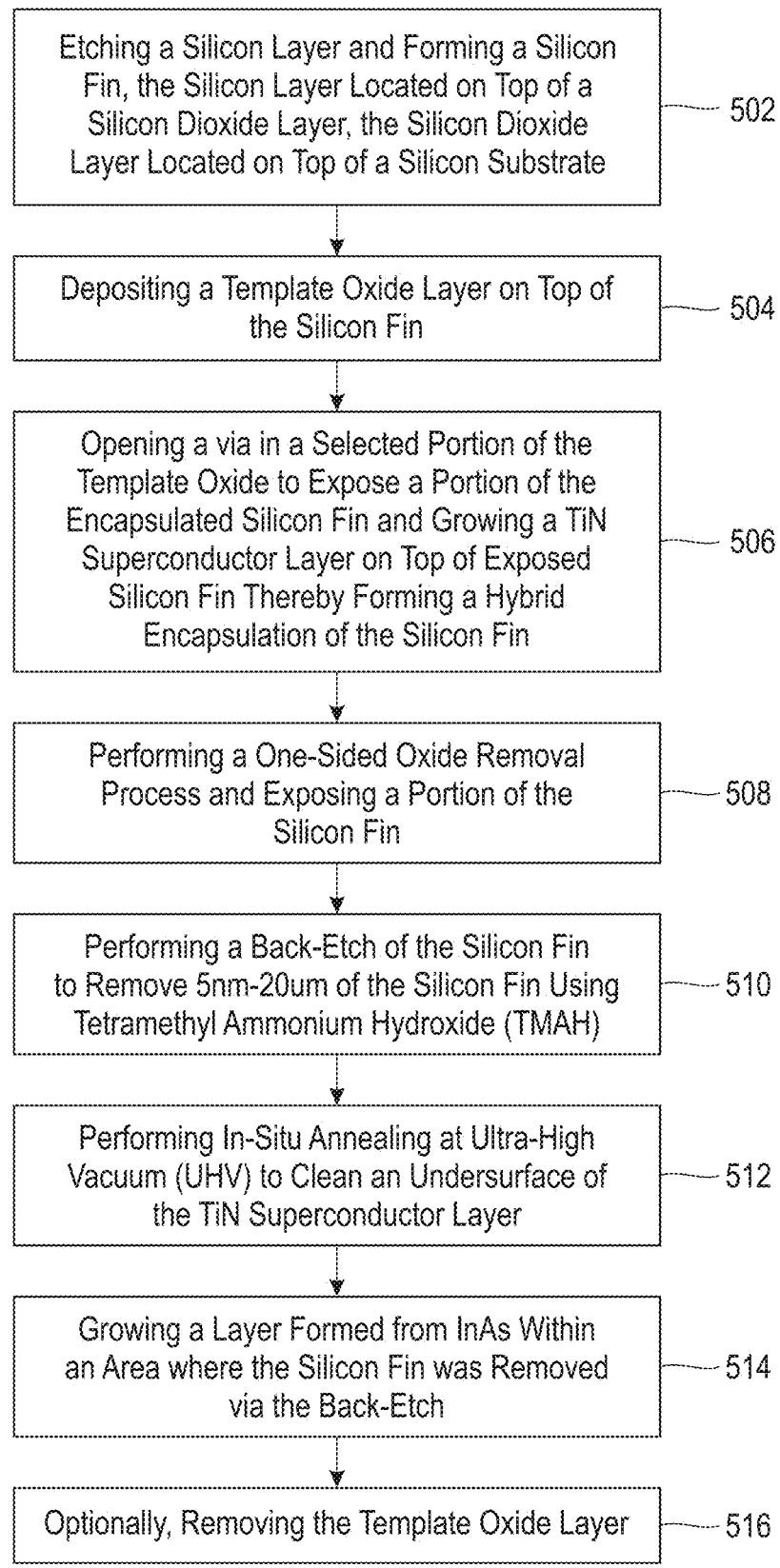
FIG. 5 depicts yet another aspect of the present invention's hybrid template assisted selective epitaxy (HTASE) method.

FIG. 5 depicts another aspect of the present invention's hybrid template assisted selective epitaxy (HTASE) method. The method, according to this aspect, comprises the steps of: (a) etching a silicon layer and forming a silicon fin, the silicon layer located on top of a silicon dioxide layer, the silicon dioxide layer located on top of a silicon substrate—step 502; (b) depositing a template oxide layer on top of the silicon fin—step 504; (c) opening a via in a selected portion of the template oxide to expose a portion of the encapsulated silicon fin and growing a TiN superconductor layer on top of the exposed silicon fin thereby forming a hybrid encapsulation of the silicon fin—step 506; (d) performing a one-sided oxide removal process and exposing a portion of the silicon fin—step 508; (e) performing a back-etch of the silicon fin to remove a portion (e.g., 5 nm-20 um) of the silicon fin using tetramethyl ammonium hydroxide (TMAH) and/or potassium hydroxide (KOH)—step 510; (f) performing in-situ annealing at ultra-high vacuum (UHV) to clean an undersurface of the nitride superconductor layer—step 512; (g) growing a layer formed from InAs within an area where the silicon fin was removed via the back-etch—step 514; and (h) if needed, removing the template oxide layer—step 516.

Figure 6B:
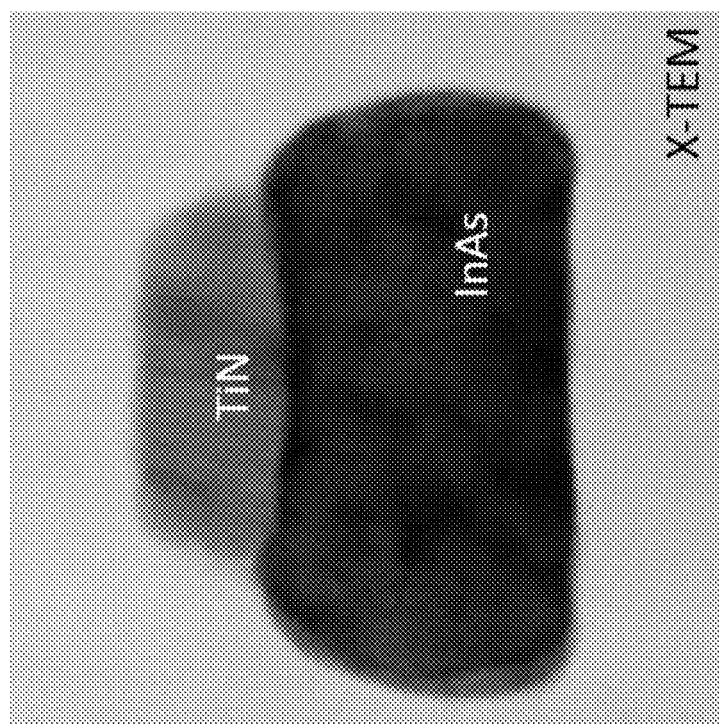
FIG. 6B depicts a Cross-section Transmission Electron Microscope (X-TEM) image of the lamella as indicated in FIG. 6A, showing a clear demarcation between the TiN and InAs layers without any other intervening layers.
Figure 6A:
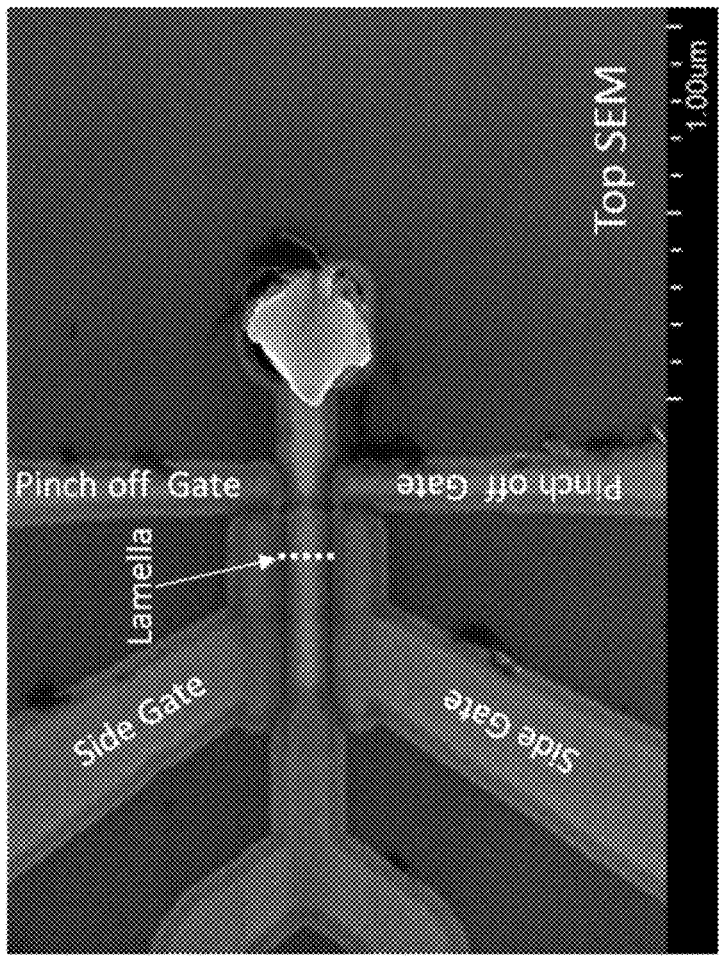
FIG. 6A depicts an example structure developed as per the teachings of the HTASE method described above, where top-down Scanning Electron Microscope (SEM) image shows InAs nanowire grown into a hybrid template formed from part $SiO_2$ and part TiN, where the InAs layer is grown from a Silicon seed within an area where the silicon fin was removed via the back-etch.

FIG. 6A depicts an example structure developed as per the teachings of the HTASE method described above, where top-down Scanning Electron Microscope (SEM) image shows InAs nanowire grown into a hybrid template formed from part $SiO_2$ and part TiN, where the InAs layer is grown from a Silicon seed within an area where the silicon fin was removed via the back-etch.

FIG. 6B depicts a Cross-section Transmission Electron Microscope (X-TEM) image of the lamella as indicated in FIG. 6A, showing a clear demarcation between the TiN and InAs layers without any other intervening layers.

CONCLUSION

A system and method have been shown in the above embodiments for the effective implementation of a hybrid template assisted selective epitaxy (HTASE) technique. While various preferred embodiments have been shown and described, it will be understood that there is no intent to limit the invention by such disclosure, but rather, it is intended to cover all modifications falling within the spirit and scope of the invention, as defined in the appended claims.

The invention claimed is:

1. A hybrid template assisted selective epitaxy (HTASE) method comprising steps of:
   (a) depositing a template oxide layer on top of a silicon fin so as to encapsulate the silicon fin;
   (b) opening a via in a selected portion of the template oxide layer to expose a portion of the encapsulated silicon fin and subsequently growing a nitride superconductor layer on top of the exposed silicon fin, thereby forming a hybrid encapsulation of the silicon fin;
   (c) performing a one-sided oxide removal process and exposing a portion of the silicon fin;
   (d) performing a back-etch of the silicon fin to remove a portion of the silicon fin; and
   (e) growing a layer formed from a group III/group V compound within an area where the silicon fin was removed via the back-etch.

2. The HTASE method of claim 1, wherein the portion of the silicon fin that is removed is 5 nm-20 um in length.

3. The HTASE method of claim 1, wherein the method further comprises a step of removing the template oxide layer.

4. The HTASE method of claim 1, wherein the silicon fin is formed by etching a silicon layer, the silicon layer located on top of a silicon dioxide layer, the silicon dioxide layer located on top of a silicon substrate.

5. The HTASE method of claim 1, wherein, prior to performing the back-etch, a portion of the silicon fin is exposed based on a one-sided oxide removal process.

6. The HTASE method of claim 1, wherein, prior to growing a layer of a group III/group V compound, in-situ annealing is performed at ultra-high vacuum (UHV) to clean an undersurface of the nitride superconductor layer.

7. The HTASE method of claim 1, wherein the group III/group V compound is InAs.

8. The HTASE method of claim 1, wherein the back-etch in (c) is done using tetramethyl ammonium hydroxide (TMAH).

9. The HTASE method of claim 1, wherein the back-etch in (c) is done using potassium hydroxide (KOH).

10. The HTASE method of claim 1, wherein the nitride superconductor layer is formed from TiN.

11. The HTASE method of claim 1, wherein the nitride superconductor layer is formed without a silicon nitride interface.

12. The HTASE method of claim 1, wherein the nitride superconductor layer is formed from a member selected from the group consisting of TiN, VN, MoN, ZrN, and WN, and combinations thereof.

13. The HTASE method of claim 1, wherein the step of growing a layer formed from a group III/group V compound is done via a metal organic chemical vapor deposition (MOCVD) process.

14. A hybrid template assisted selective epitaxy (HTASE) method comprising steps of:
   (a) etching a silicon layer and forming a silicon fin, the silicon layer located on top of a silicon dioxide layer, the silicon dioxide layer located on top of a silicon substrate;
   (b) depositing a template oxide layer on top of the silicon fin so as to encapsulate the silicon fin;
   (c) opening a via in a selected portion of the template oxide layer to expose a portion of the encapsulated silicon fin and subsequently growing a nitride superconductor layer on top of the exposed silicon fin, thereby forming a hybrid encapsulation of the silicon fin;
   (d) performing a one-sided oxide removal process and exposing a portion of the silicon fin;

(e) performing a back-etch of the silicon fin to remove a portion of the silicon fin;
(f) performing in-situ annealing at ultra-high vacuum (UHV) to clean an undersurface of the nitride superconductor layer; and
(g) growing a layer formed from a group III/group V compound within an area where the silicon fin was removed via the back-etch.

15. The HTASE method of claim 14, wherein the portion of the silicon fin that is removed is 5 nm-20 um in length.

16. The HTASE method of claim 14, wherein the method further comprises a step of removing the template oxide layer.

17. The HTASE method of claim 14, wherein the group III/group V compound is InAs.

18. The HTASE method of claim 14, wherein the back-etch in (e) is done using tetramethyl ammonium hydroxide (TMAH).

19. The HTASE method of claim 14, wherein the back-etch in (e) is done using potassium hydroxide (KOH).

20. The HTASE method of claim 14, wherein the nitride superconductor layer is formed from any of, or combinations of: TiN, VN, MoN, ZrN, and WN.

21. The HTASE method of claim 14, wherein the nitride superconductor layer is formed without a silicon nitride interface.

22. The HTASE method of claim 14, wherein the step of growing a layer formed from a group III/group V compound is done via a metal organic chemical vapor deposition (MOCVD) process.

23. A hybrid template assisted selective epitaxy (HTASE) method comprising steps of:

(a) etching a silicon layer and forming a silicon fin, the silicon layer located on top of a silicon dioxide layer, the silicon dioxide layer located on top of a silicon substrate;
(b) depositing a template oxide layer on top of the silicon fin so as to encapsulate the silicon fin;
(c) opening a via in a selected portion of the template oxide layer to expose a portion of the encapsulated silicon fin and subsequently growing a TiN superconductor layer on top of the exposed silicon fin, thereby forming a hybrid encapsulation of the silicon fin;
(d) performing a one-sided oxide removal process and exposing a portion of the silicon fin;
(e) performing a back-etch of the silicon fin to remove a portion of the silicon fin using tetramethyl ammonium hydroxide (TMAH) and/or potassium hydroxide (KOH);
(f) performing in-situ annealing at ultra-high vacuum (UHV) to clean an undersurface of the nitride superconductor layer; and
(g) growing a layer formed from InAs within an area where the silicon fin was removed via the back-etch.

24. The HTASE method of claim 23, wherein the portion of the silicon fin that is removed is 5 nm-20 um in length.

25. The HTASE method of claim 23, wherein the method further comprises a step of removing the template oxide layer.

26. The HTASE method of claim 23, wherein the step of growing a layer formed from InAs compound is done via a metal organic chemical vapor deposition (MOCVD) process.

27. The HTASE method of claim 23, wherein the nitride superconductor layer is formed without a silicon nitride interface.

* * * * *